United States Patent
Cheng et al.

(10) Patent No.: US 8,284,553 B2
(45) Date of Patent: Oct. 9, 2012

(54) POWER SUPPLY DEVICE HAVING HEAT-DISSIPATING FUNCTION

(75) Inventors: Wen-Chieh Cheng, Taipei Hsien (TW); Hsin-Hao Chen, Taipei Hsien (TW); Kuang-Hung Chen, Taipei Hsien (TW)

(73) Assignee: Wistron Corporation, Taipei Hsien (TW)

( * ) Notice: Subject to any disclaimer, the term of this patent is extended or adjusted under 35 U.S.C. 154(b) by 227 days.

(21) Appl. No.: 12/861,024

(22) Filed: Aug. 23, 2010

(65) Prior Publication Data

US 2011/0255245 A1   Oct. 20, 2011

(30) Foreign Application Priority Data

Apr. 19, 2010   (TW) ................................ 99207081 U

(51) Int. Cl.
*H05K 7/20*        (2006.01)
*F28F 7/00*        (2006.01)

(52) U.S. Cl. .............. 361/679.48; 361/679.46; 361/695; 165/185; 454/184; 363/141; 174/547

(58) Field of Classification Search ............. 361/679.46, 361/679.48, 695; 165/185; 257/712–713, 257/721; 454/184; 363/141; 174/16.1, 547
See application file for complete search history.

(56) References Cited

U.S. PATENT DOCUMENTS

| | | | | |
|---|---|---|---|---|
| 5,898,569 | A * | 4/1999 | Bhatia | 361/700 |
| 7,436,661 | B2 * | 10/2008 | Fong et al. | 361/695 |
| 7,679,906 | B2 * | 3/2010 | Fong et al. | 361/695 |
| 7,733,647 | B2 * | 6/2010 | Lee | 361/690 |
| 7,929,301 | B2 * | 4/2011 | Fong et al. | 361/695 |
| 8,000,099 | B2 * | 8/2011 | Parker | 361/679.48 |
| 2006/0227516 | A1 * | 10/2006 | Huang et al. | 361/729 |

* cited by examiner

*Primary Examiner* — Zachary M Pape
(74) *Attorney, Agent, or Firm* — Nixon & Vanderhye P.C.

(57) ABSTRACT

A power supply device includes a transformer and a heat-dissipating mechanism. The heat-dissipating mechanism includes a heat-dissipating fan unit and an activating unit. The heat-dissipating fan unit is connected pivotally to the transformer, and is pivotable relative to the transformer to lie on a top surface of the transformer. An inclination angle of the heat-dissipating fan unit relative to the top surface of the transformer is adjustable. The activating unit includes a control switch for controlling activation of the heat-dissipating fan unit.

20 Claims, 11 Drawing Sheets

US 8,284,553 B2

POWER SUPPLY DEVICE HAVING HEAT-DISSIPATING FUNCTION

CROSS-REFERENCE TO RELATED APPLICATION

This application claims priority of Taiwanese Application No. 099207081, filed on Apr. 19, 2010.

BACKGROUND OF THE INVENTION

1. Field of the Invention

This invention relates to a power supply device having heat-dissipating function, and more particularly to a power supply device that includes a foldable and angle-adjustable heat-dissipating fan unit, and an assembly of the power supply device and a portable electronic device.

2. Description of the Related Art

Referring to FIGS. 1 and 2, a heat-dissipating device for a notebook computer, which is disclosed in Taiwanese Patent No. M368115 (Application No. 098208891), includes a body 11 and a heat-dissipating fan unit 12. The body 11 has a top surface that permits the notebook computer to be disposed thereon and that is formed with a plurality of circular holes 111. Four headed bolts 13 extend respectively through four of the circular holes 111 to engage respectively four threaded holes in the heat-dissipating fan unit 12 so as to connect the heat-dissipating fan unit 12 fixedly to the body 11 for dissipating heat from a bottom portion of the notebook computer.

The heat-dissipating device, however, is bulky, and occupies a large amount of space, thereby resulting in inconvenience during use of the notebook computer

SUMMARY OF THE INVENTION

An object of this invention is to provide a power supply device with an improved heat-dissipating fan unit that is foldable to reduce the space occupied by the power supply device so that the power supply device can be carried easily.

Another object of this invention is to provide an assembly of a power supply device having heat-dissipating function and a portable electronic device, which includes a heat-dissipating fan unit foldable to reduce the space occupied by the assembly so that the assembly can be carried easily.

According to an aspect of this invention, there is provided a power supply device comprising:
a transformer having a top surface; and
a heat-dissipating mechanism including
a heat-dissipating fan unit connected pivotally to the transformer and pivotable relative to the transformer to lie on the top surface of the transformer, an inclination angle of the heat-dissipating fan unit relative to the top surface being adjustable, and
an activating unit including a control switch for controlling activation of the heat-dissipating fan unit.

According to another aspect of this invention, there is provided an assembly comprising:
a portable electronic device; and
a power supply device including
a transformer having a top surface,
a firsts power transmission line connected to one end of the transformer,
a second power transmission line connected to the other end of the transformer and connected removably and electrically to the portable electronic device, and
a heat-dissipating mechanism including
a heat-dissipating fan unit connected pivotally to the transformer and pivotable relative to the transformer to lie on the top surface of the transformer, an inclination angle of the heat-dissipating fan unit relative to the top surface being adjustable, and an activating unit including a control switch for controlling activation of the heat-dissipating fan unit.

As such, the heat-dissipating fan unit can be supported and maintained at a selected one of a plurality of inclined positions or folded on the transformer, thereby resulting in convenience during use of the power supply device. When the heat-dissipating fan unit is folded on the transformer, the power supply device is easy to carry.

BRIEF DESCRIPTION OF THE DRAWINGS

These and other features and advantages of this invention will become apparent in the following detailed description of the preferred embodiments of this invention, with reference to the accompanying drawings, in which.

DETAILED DESCRIPTION OF THE PREFERRED EMBODIMENTS

Figure 1:
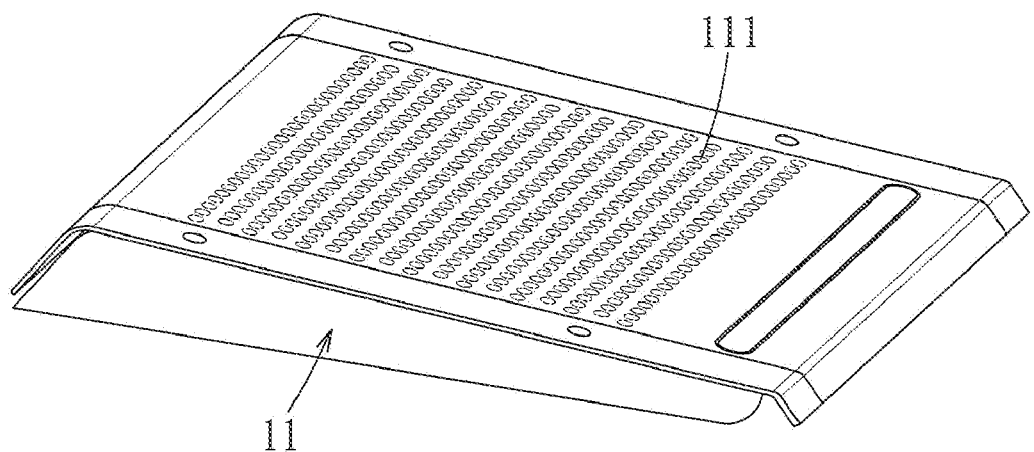
FIG. 1 is a top perspective view of a conventional notebook computer disclosed in Taiwanese Patent No. M368115.
Figure 2:
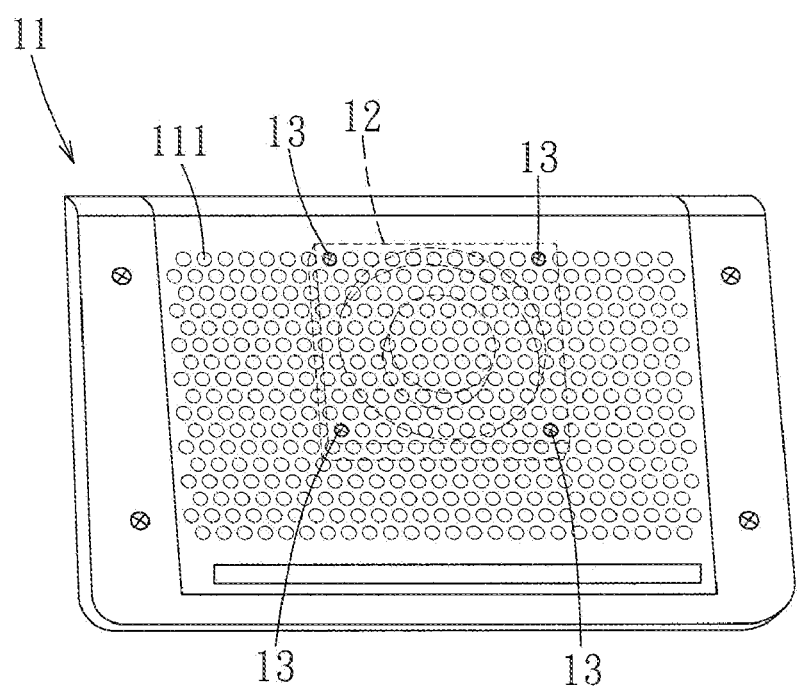
FIG. 2 is a bottom perspective view of the conventional notebook computer.

Before the present invention is described in greater detail in connection with the preferred embodiments, it should be noted that similar elements and structures are designated by like reference numerals throughout the entire disclosure.

Figure 3:
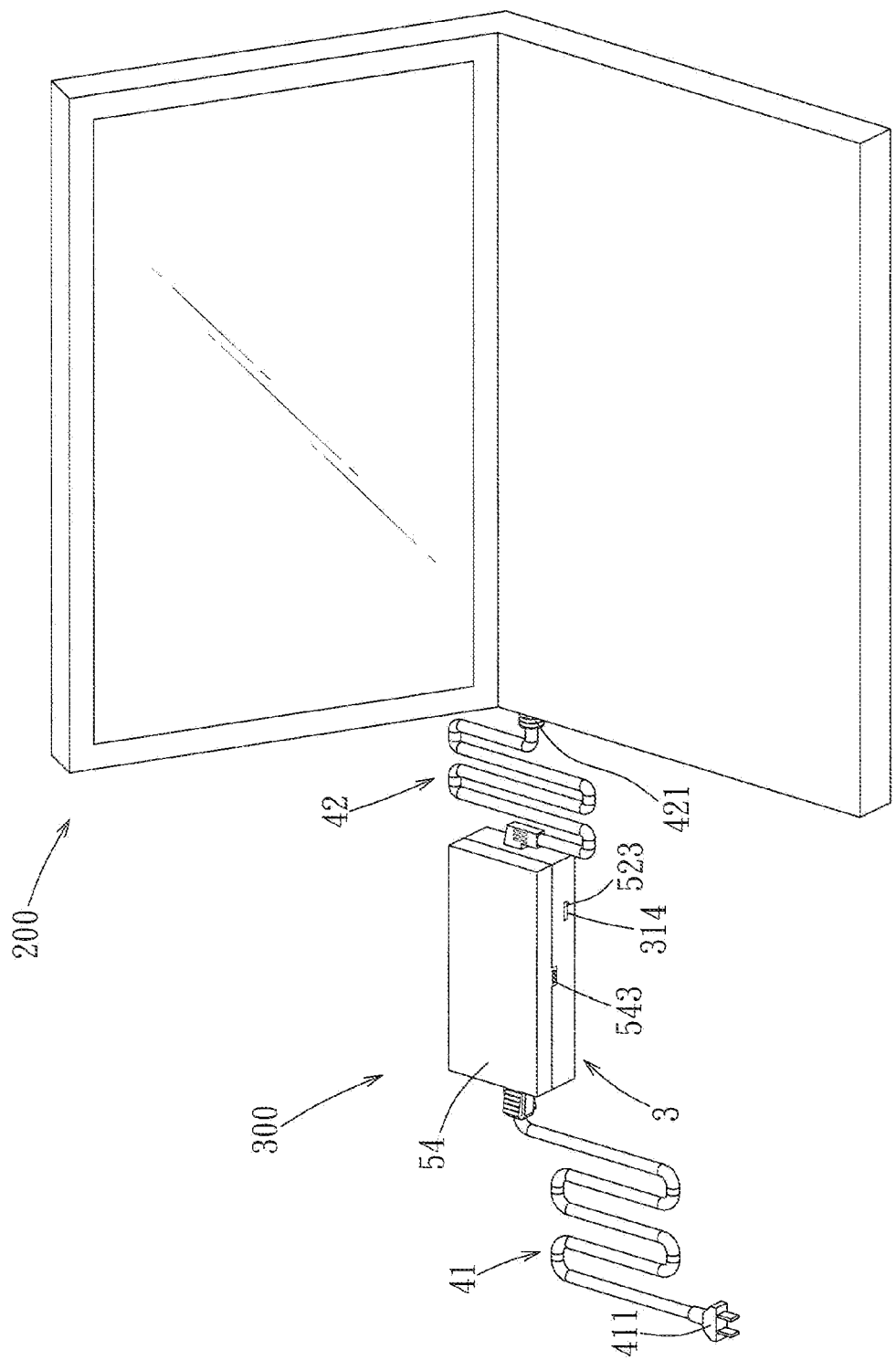
FIG. 3 is a perspective view of the first preferred embodiment of an assembly of a power supply device and a portable electronic device according to this invention.

Referring to FIG. 3, the first preferred embodiment of an assembly according to this invention includes a power supply device 300 and a portable electronic device 200. In this embodiment, the portable electronic device 200 is exemplified using a notebook computer.

The power supply device 300 includes a transformer 3, a first power transmission line 41 connected to one end of the transformer 3, and a second power transmission line 42 connected to the other end of the transformer 3. The first power transmission line 41 is provided with a power plug 411 that is inserted into a power socket (not shown). The second power transmission line 42 is provided with an electrical plug 421 connected removably and electrically to the portable electronic device 200. Alternating current transmitted from the first power transmission line 41 is converted into direct current by the transformer 3. The direct current is transmitted to the portable electronic device 200 by the second power transmission line 42 so as to provide electricity required for operation of the portable electronic device 200.

Figure 4:
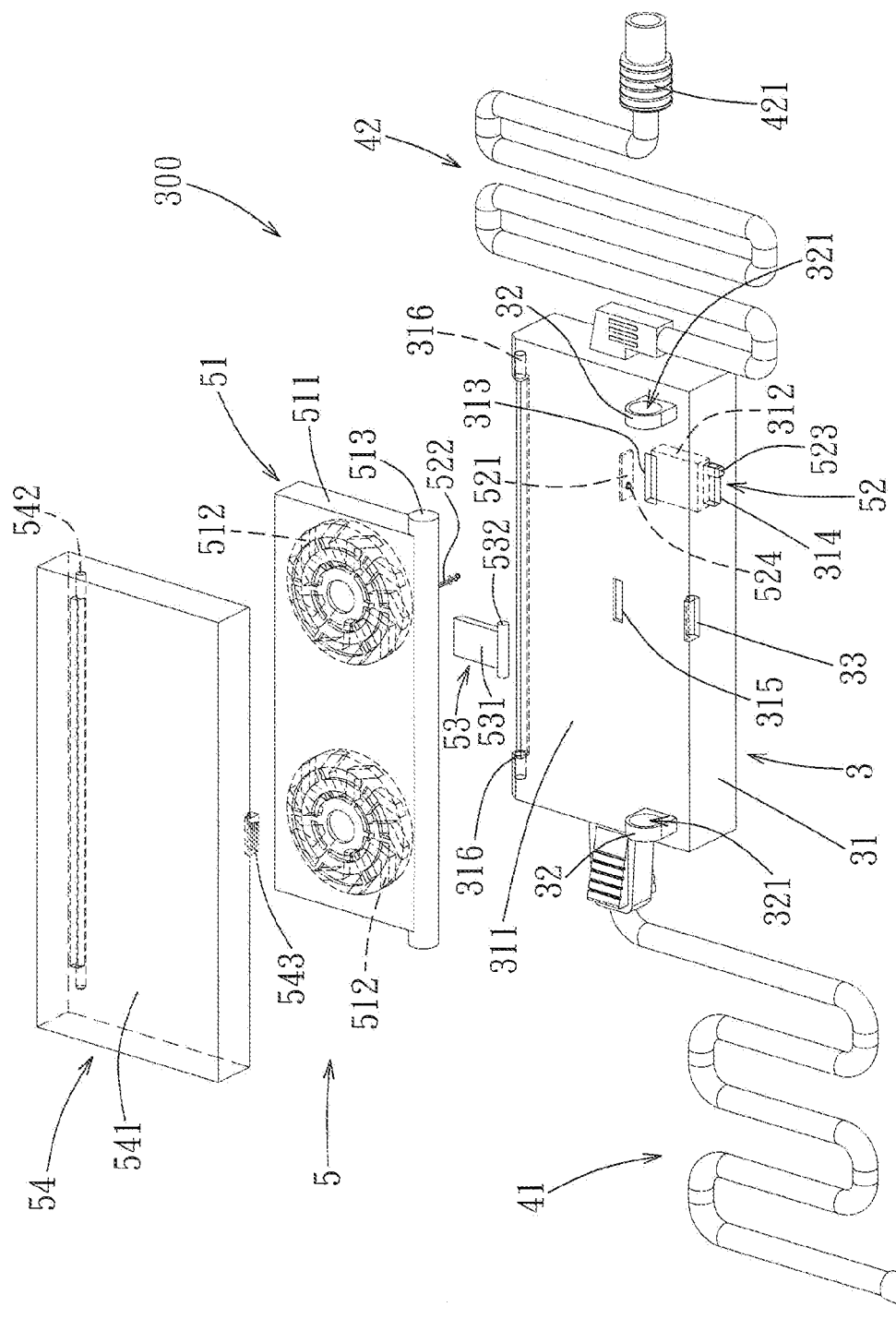
FIG. 4 is an exploded perspective view of the first preferred embodiment, illustrating connection relation between a heat-dissipating mechanism and a transformer.

With further reference to FIG. 4, the power supply device 300 further includes a heat-dissipating mechanism 5. The heat-dissipating mechanism 5 includes a heat-dissipating fan unit 51, and an activating unit 52 for controlling activation of the heat-dissipating fan unit 51. The heat-dissipating fan unit 51 includes a housing 511 and two fan bodies 512 disposed within the housing 511. The transformer 3 includes a shell 31 having a top surface 311, on which two projections 312 are formed. The projections 312 are spaced apart from each other along a left-to-right direction. An integral pivot pin 513 of the housing 511 has two ends disposed respectively and rotatably within pivot holes 321 in the projections 32. As such, the heat-dissipating fan unit 51 is rotatable between the projections 32 and about a central axis of the pivot pin 513 so that the direction of the airflow created during operation of the heat-dissipating fan unit 51 can be adjusted.

The shell 31 of the transformer 3 includes an accommodating space 312 having an opening 313 formed in the top surface 311. A front surface of the shell 3 is formed with a guide slot 314 communicated with the accommodating space 312 and the surroundings. In other words, the guide slot 314 is disposed in front of the accommodating space 312. The activating unit 52 includes a circuit board 521 disposed within the accommodating space 312, an electrical wire 522, and a control switch 523. The first power transmission line 41 is used to transmit electrical power to the circuit board 521 via the transformer 3. The electrical wire 522 extends through the opening 313, and is connected electrically between the circuit board 521 and the fan bodies 512 of the heat-dissipating fan unit 51 so as to provide electricity required for operation of the fan bodies 512. The control switch 523 extends through the guide slot 314, is operable to move the pushing portion 526 along a longitudinal direction of the guide slot 314 between two ends of the guide slot 314 to contact or separate from a contact portion 524 (see FIG. 4) of the circuit board 521 for controlling supply of electrical power to the circuit board 521 and, thus, activation of the fan bodies 512 of the heat-dissipating fan unit 51.

The heat-dissipating mechanism 5 further includes a supporting member 53 that is elongated and that is disposed within an accommodating groove 515 in a back surface 514 of the housing 511. The supporting member 53 includes a plate body 531 and a pivot pin 532 that is connected to a side of the plate body 531 and that is disposed pivotally in a pivot hole portion 516 of the accommodating space 515. An opposite side or free end of the plate body 531 can be rotated about a central axis of the pivot pin 532 by an angle to engage an engaging groove 315 in the top surface 311 to thereby support and maintain the heat-dissipating fan unit 51 at an inclined position shown in FIG. 7. Alternatively, the width of the top surface 311 along a front-to-rear direction may be increased, and the top surface 111 may be formed with a plurality of engaging grooves 315 spaced apart from each other along the front-to-rear direction, so as to allow the plate body 531 of the supporting member 53 to engage a selected one of the engaging grooves 315, thereby supporting and maintaining the heat-dissipating fan unit 51 at a desired inclination angle.

Figure 6:
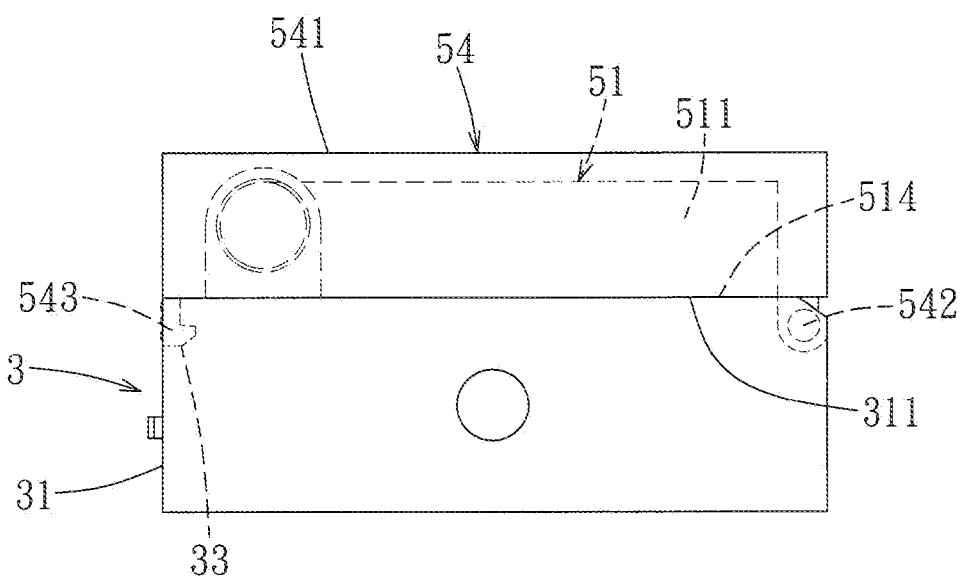
FIG. 6 is a side view of the power supply device of the first preferred embodiment, illustrating a protective cover at a covering position.

With further reference to FIG. 6, the heat-dissipating mechanism 5 further includes a protective cover 54 connected pivotally to the shell 31 of the transformer 3. The protective cover 54 includes a cover body 541, and a pivot pin 542 disposed on a rear end of the cover body 541 and having two ends extending respectively and rotatably into two pivot holes 316 in a rear end of the shell 31 to allow rotation of the protective cover 54 about a central axis of the pivot pin 542 relative to the shell 31. When the heat-dissipating fan unit 51 is disposed at a folded position shown in FIG. 6 whereat the heat-dissipating fan unit 51 lies on the transformer 3 (i.e., the back surface 514 of the housing 511 of the heat-dissipating fan unit 51 abuts against the top surface 311 of the shell 31), the cover body 541 of the protective cover 54 can be pivoted to a covering position shown in FIG. 6 for covering and protecting the heat-dissipating fan unit 51 from damage. Preferably, the transformer 3 further includes a retaining groove 33 formed in a front end of the shell 31. The protective cover 54 further includes a retaining hook 543 disposed on a front end of the cover body 541. The retaining hook 543 of the protective cover 54 is engageable removably within the retaining groove 33 to maintain the cover body 541 of the protective cover 54 at the covering position.

Figure 5:
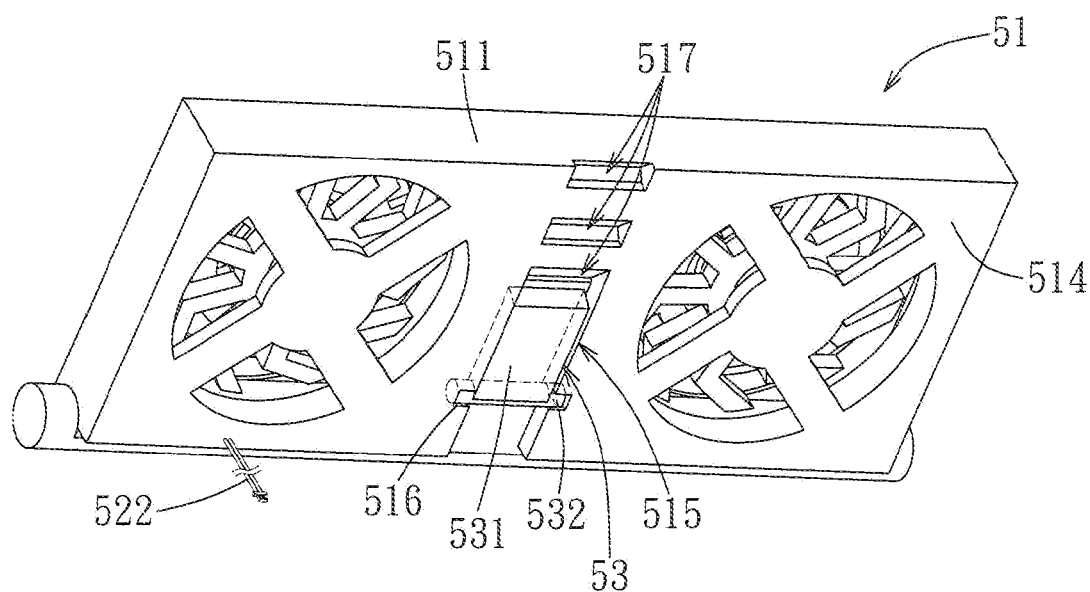
FIG. 5 is a perspective view of a heat-dissipating fan unit of the first preferred embodiment.

With particular reference to FIGS. 4 and 5, the back surface 514 of the housing 511 of the heat-dissipating fan unit 51 is further formed with a plurality of positioning grooves 517 that are arranged spacedly along the front-to-rear direction and that are disposed at a middle portion of the housing 511. Since the heat-dissipating fan unit 51 and the protective cover 54 are connected respectively and pivotally to the front and rear ends of the transformer 3, by pivoting a free end (i.e., rear side) of the heat-dissipating fan unit 51 away from the top surface 311 of the shell 31, the retaining hook 543 of the protective cover 54 can be engaged to a selected one of the positioning grooves 517 to thereby support and maintain the heat-dissipating fan unit 51 at a desired inclined position.

Figure 7:
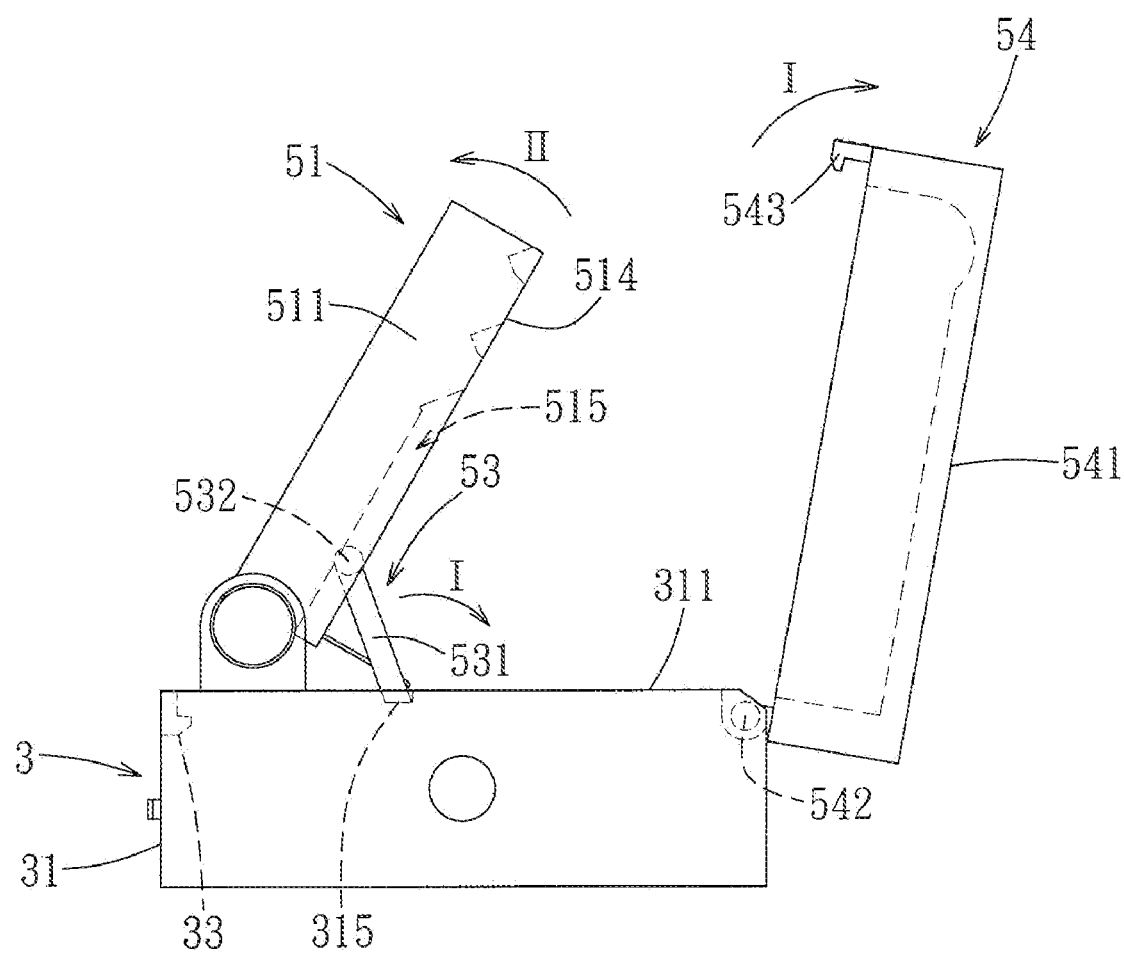
FIG. 7 is a side view of the power supply device of the first preferred embodiment, illustrating a heat-dissipating fan unit at an inclination angle of 60 degrees relative to the transformer.
Figure 8:
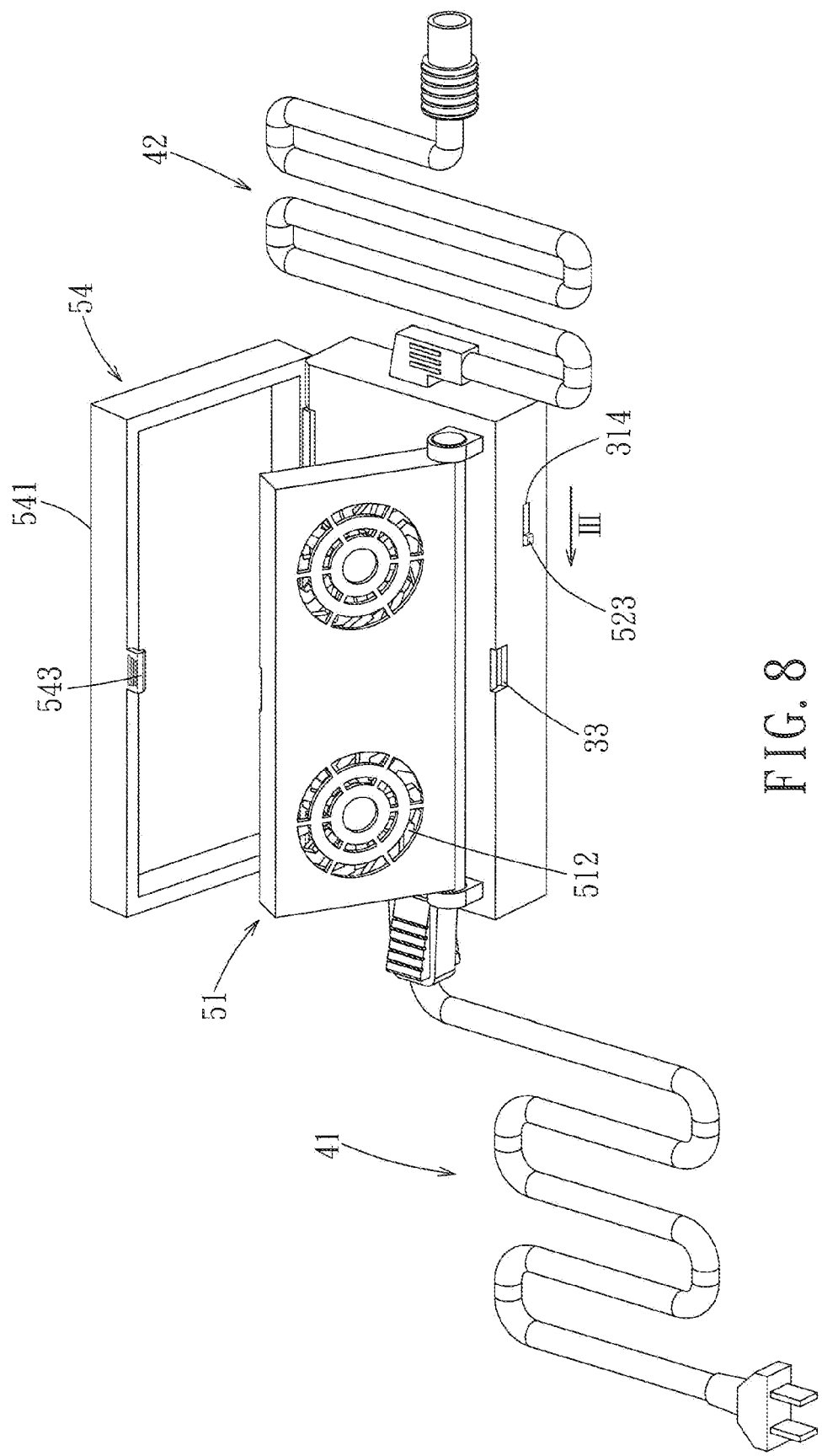
FIG. 8 is a perspective view of the power supply device of the first preferred embodiment.

With particular reference to FIGS. 3, 6, 7, and 8, during use of the portable electronic device 200, heat can be dissipated from the portable electronic device 200 by the heat-dissipating mechanism 5. When such heat dissipation is desired, the retaining hook 543 of the protective cover 54 is first pivoted away from the retaining groove 33 in the transformer 3 in a first (i.e., clockwise) direction (I) (see FIG. 7), until the cover body 541 of the protective cover 54 comes into contact with a rear surface of the shell 31, as shown in FIG. 7, thereby preventing further rotation of the protective cover 54 in the first direction (I). Next, the heat-dissipating fan unit 51 is pivoted away from the top surface 311 of the shell 31 in a second direction (II) (i.e., counterclockwise) (see FIG. 7) to align the plate body 531 of the supporting member 53 with the engaging groove 315. Subsequent to the pivoting movement of the heat-dissipating fan unit 51, the supporting member 53 is pivoted relative to the plate body 531 in the first direction (I) to engage the engaging groove 315 to thereby maintain the heat-dissipating fan unit 51 at a first inclined position shown in FIG. 7. In this position, the back surface 514 of the heat-dissipating fan unit 51 forms an inclination angle of about 60 degrees relative to the top surface 311 of the shell 31.

Afterwards, the control switch 523 is moved along the guide slot 314 in a third direction (III) (see FIG. 8) to contact the contact portion 524 of the circuit board 521. Hence, electrical power is supplied to the circuit board 521 to thereby rotate the fan bodies 512. The transformer 3 can be rotated relative to the portable electronic device 200 to allow air to be forced by the heat-dissipating fan unit 51 to flow toward a portion of the heat-dissipating electronic device 200 that requires heat dissipation. In this manner, the heat-dissipating effect of the heat-dissipating fan unit 51 can be promoted. It should be noted that, the air forced by the heat-dissipating fan unit 51 might be directed toward the user.

Figure 9:
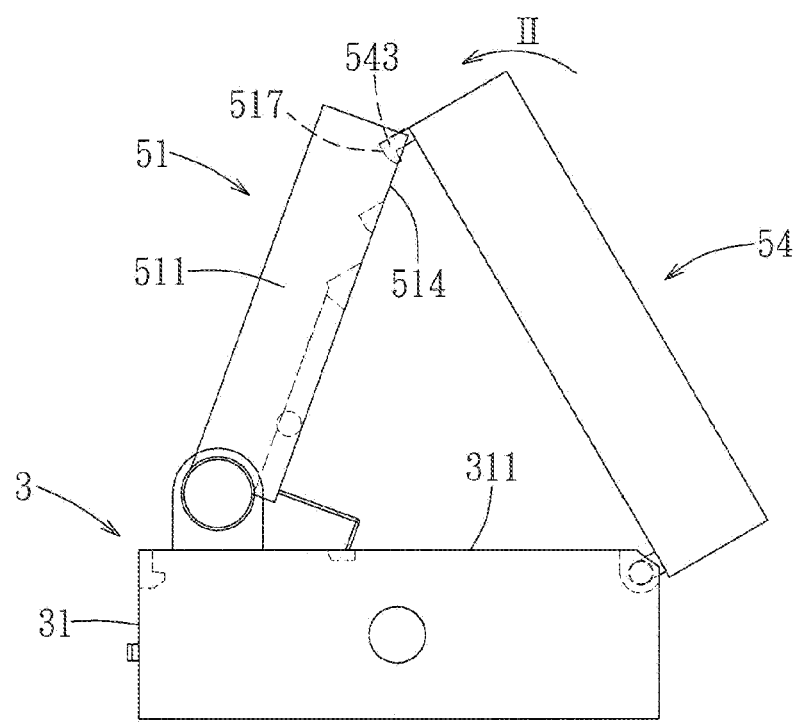
FIG. 9 is a side view of the power supply device of the first preferred embodiment, illustrating the heat-dissipating fan unit at an inclination angle of 70 degrees relative to the transformer.
Figure 10:
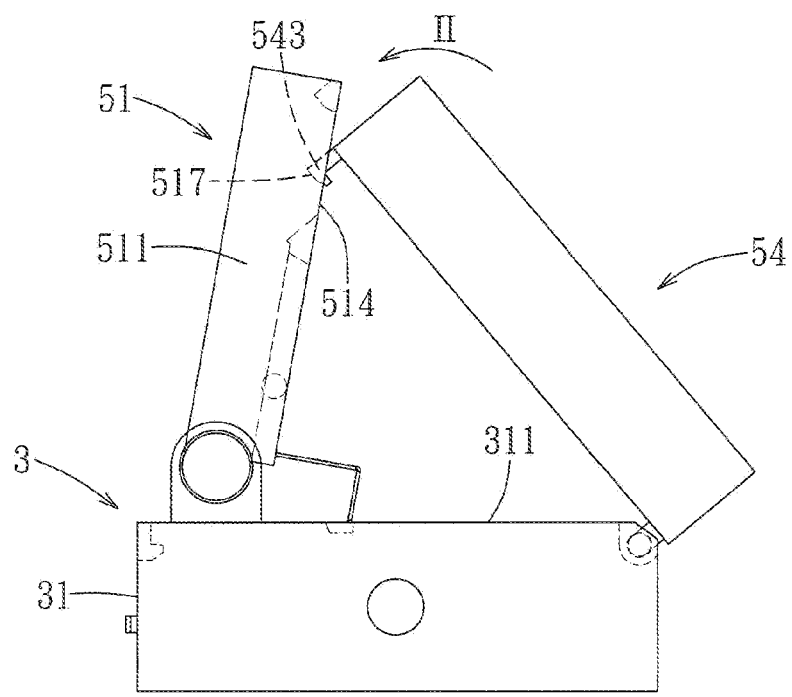
FIG. 10 is a side view of the power supply device of the first preferred embodiment, illustrating the heat-dissipating fan unit at an inclination angle of 80 degrees relative to the transformer.
Figure 11:
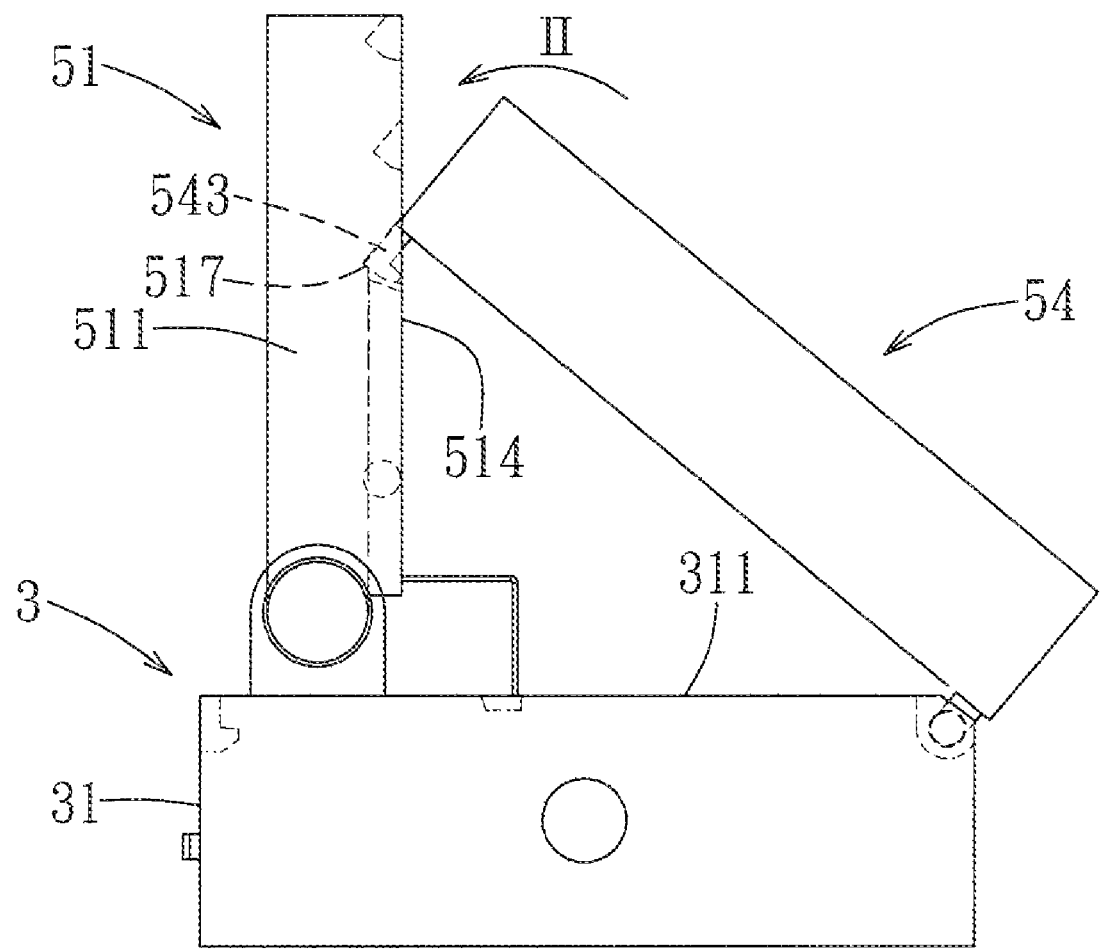
FIG. 11 is a side view of the power supply device of the first preferred embodiment, illustrating the heat-dissipating fan unit at a vertical position.

When it is desired to adjust the inclination angle of the heat-dissipating fan unit 51, the supporting member 53 is pivoted into the accommodating groove 515 in the housing 511. Subsequently, the protective cover 54 is pivoted relative to the transformer 3 in the second direction (II) to engage the retaining hook 543 with a selected one of the positioning grooves 517. In this embodiment, the number of the positioning grooves 517 is three. When the retaining hook 543 is engaged within an upper one of the positioning grooves 517, as shown in FIG. 9, the back surface 514 of the heat-dissipating fan unit 51 forms an inclination angle of about 70 degrees with respect to the top surface 311 of the shell 31 to maintain the heat-dissipating fan unit 51 at a second inclined position. When the retaining hook 543 is engaged within a middle one of the positioning grooves 517, as shown in FIG. 10, the back surface 514 of the heat-dissipating fan unit 51 forms an inclination angle of about 80 degrees with respect to the top surface 311 of the shell 31 to maintain the heat-dissipating fan unit 51 at a third inclined position. When the retaining hook 543 is engaged within a lower one of the positioning grooves 517, as shown in FIG. 11, the back surface 514 of the heat-dissipating fan unit 51 forms an angle of about 90 degrees with respect to the top surface 311 of the shell 31 (i.e., the heat-dissipating fan unit 51 is disposed at a vertical position).

It should be noted that, the angle formed between the back surface 514 of the heat-dissipating fan unit 51 and the top surface 311 of the shell 31 is determined based on the positions of the positioning grooves 517 and the lengths of the housing 511 of the heat-dissipating fan unit 51 and the protective cover 54. Thus, in design, the positions of the positioning grooves 517 and/or the lengths of the housing 511 of the heat-dissipating fan unit 51 and the protective cover 54 can be changed according to the need of the user to adjust the number of the inclined positions. In addition, a hinge mechanism (not shown) can be disposed between the projections 32 to facilitate rotation of the heat-dissipating fan unit 51 relative to the transformer 3.

Figure 12:
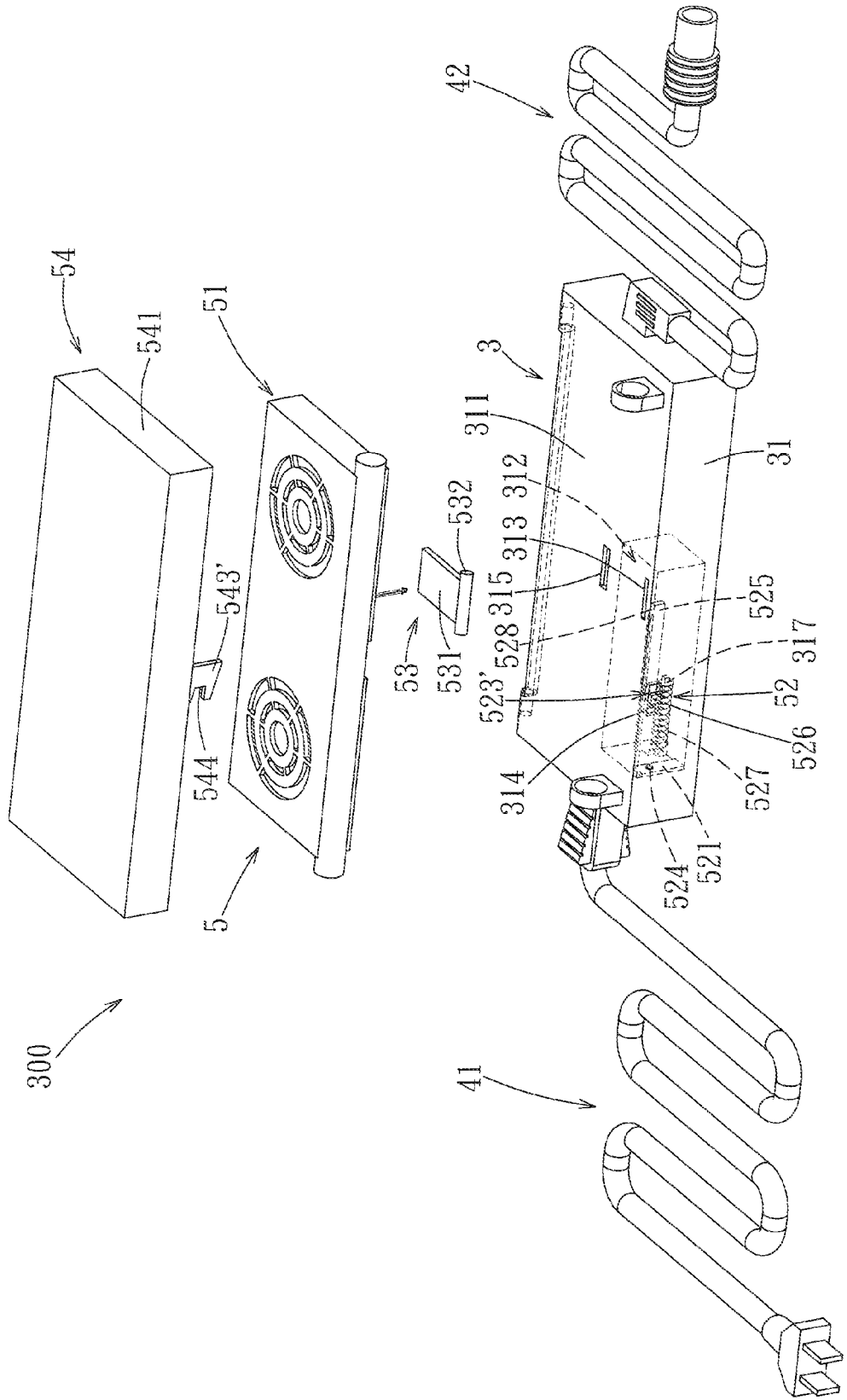
FIG. 12 is a perspective view of the second preferred embodiment of an assembly of a power supply device and a portable electronic device according to this invention.
Figure 13:
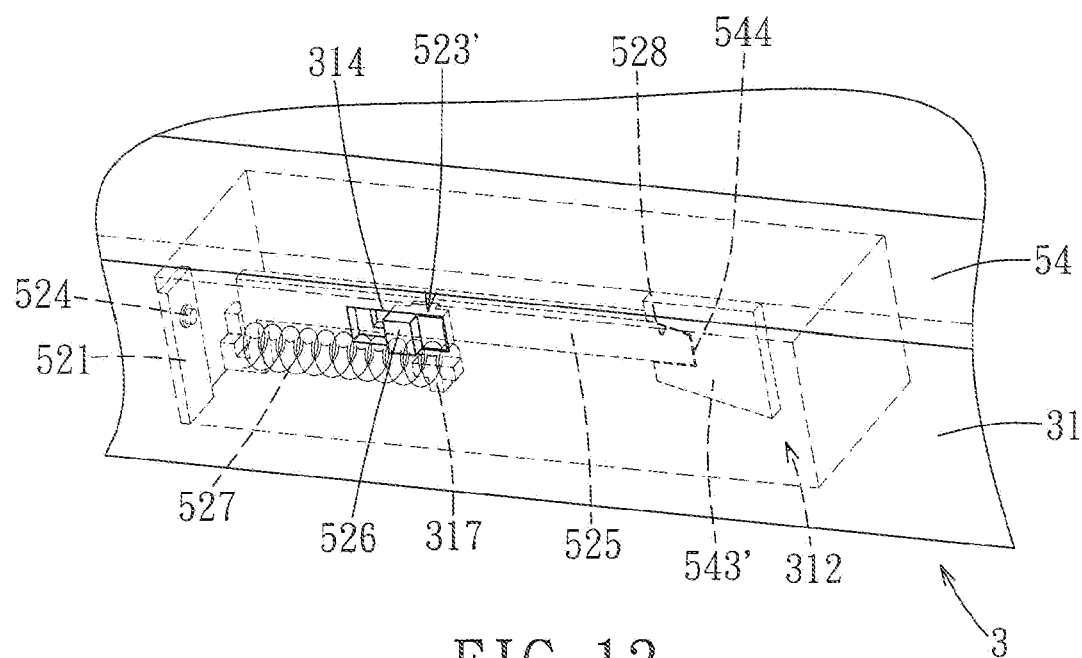
FIG. 13 is a fragmentary perspective view of the second preferred embodiment, illustrating that a retaining rod is engaged within a recess in a retaining hook and that a pushing portion of a control switch is disposed at a first position.

FIGS. 12 and 13 show the second preferred embodiment of an assembly of a power supply device 300 and a portable electronic device according to this invention, which is similar in construction to the first preferred embodiment except for the activating unit 52 and the protective cover 54 of the heat-dissipating mechanism 5.

In this embodiment, the retaining hook 543' of the protective cover 54 has a recess 544 that is open laterally. The retaining hook 543' is movable to extend into the accommodating space 312 through an opening 313 in the top surface 311 of the shell 31. The control switch 523' includes a retaining rod 525 disposed in the accommodating space 312, and a pushing portion 526 extending laterally and forwardly from the retaining rod 525 and extending through and projecting outwardly from the guide slot 314. The retaining rod 525 has a right end engageable within the recess 544 in the retaining hook 543', and a left end movable to contact the contact portion 524 of the circuit board 521. The activating unit 52 further includes a spring 527. The spring 527 is configured as a tension spring, and has two ends hooked respectively on a projecting arm 317 in the accommodating space 312 and the retaining rod 525. The spring 527 biases the retaining rod 525 to engage the recess 544 in the retaining hook 543' so that the retaining rod 525 is disposed at a retaining position shown in FIG. 13 and the pushing portion 526 of the control switch 523' is disposed at a first position shown in FIG. 13.

Figure 14:
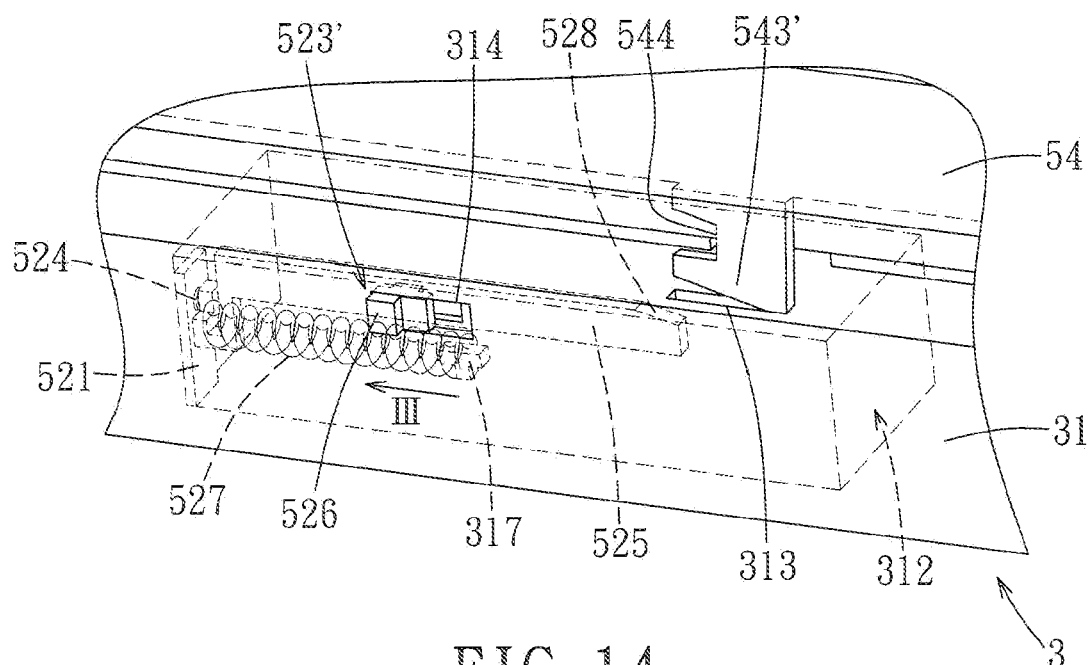
FIG. 14 is a fragmentary perspective view of the second preferred embodiment, illustrating that the retaining rod is removed from the recess in the retaining hook and is in contact with a contact portion of a circuit board and that the pushing portion of the control switch is disposed at a second position.

Referring to FIG. 14, when it is desired to open the protective cover 54, the pushing portion 526 of the control switch 523' is pushed in the third direction (III) to move along the guide slot 314 to the left to a second position to thereby stretch the spring 527. As soon as the right end of the retaining rod 525 is removed from the recess 544 in the retaining hook 543', the left end of the retaining rod 525 comes into contact with the contact portion 524 of the circuit board 521 to allow electrical power to be supplied to the circuit board 521, thereby resulting in convenience during use. When the pushing portion 526 of the control switch 523' is released, due to the biasing action of the spring 527, the retaining rod 525 is returned to the retaining position.

Figure 15:
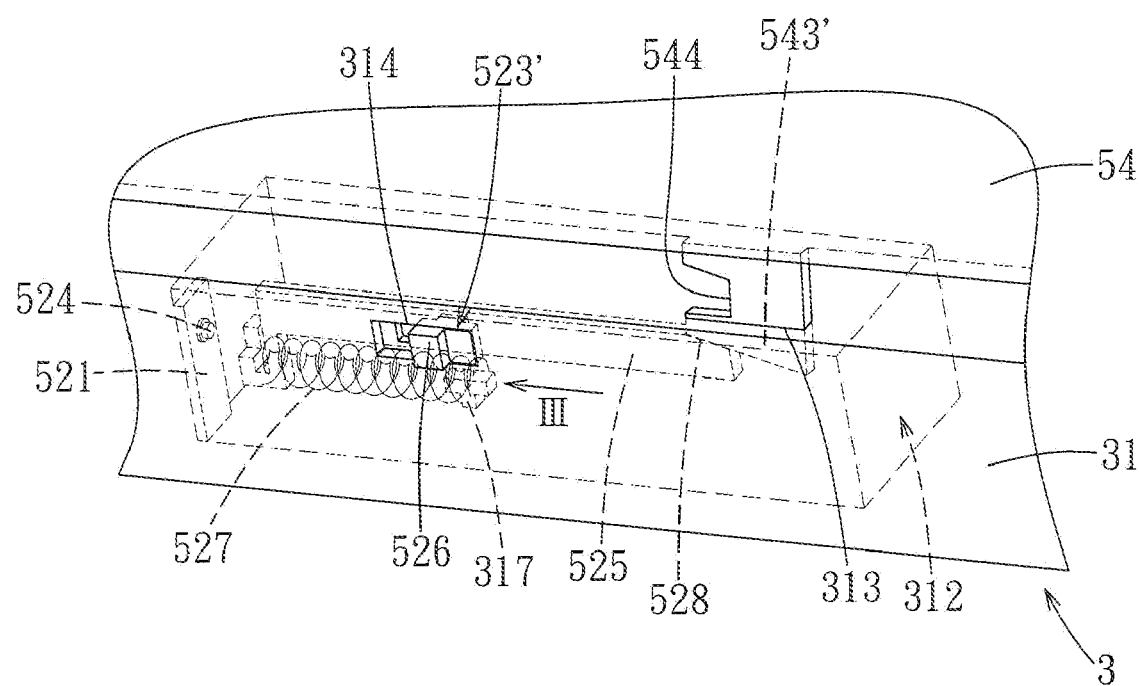
FIG. 15 is a fragmentary perspective view of the second preferred embodiment, illustrating how the retaining hook is operated to move the retaining rod toward the contact portion of the circuit board.

Referring to FIG. 15, the right end of the retaining rod 525 has an inclined surface 528 that is positioned such that, during downward pivoting movement of the protective cover 54 to the covering position and when the retaining hook 543' comes into contact with the inclined surface 528, the retaining hook 543' pushes the retaining rod 525 in the third direction (III) against the biasing action of the spring 527. Hence, the left end of the retaining rod 525 comes into contact with the contact portion 524 of the circuit board 521 so as to interrupt the supply of electrical power to the circuit board 521, thereby stopping operation of the heat-dissipating fan unit 51. When the retaining hook 543' is moved downwardly to a position aligned with the right end of the retaining rod 525, the returning force of the spring 527 returns the retaining rod 525 to the retaining position (i.e., the right end the retaining rod 525 is engaged within the recess 544 in the retaining hook 543'). As such, covering of the protective cover 54 results in deactivation of the heat-dissipating fan unit 51, so that the assembly is convenient to use.

In view of the above, in the power supply device 300, the heat-dissipating mechanism 5 is disposed on the transformer 3, and is foldable. As a consequence, the total volume of the assembly can be reduced significantly, so that the assembly is convenient to carry. Furthermore, through operation of the supporting member 53 and the protective cover 54, the heat-dissipating fan unit 51 can be supported and maintained at a desired inclined position. Thus, the objects of this invention are achieved.

With this invention thus explained, it is apparent that numerous modifications and variations can be made without departing from the scope and spirit of this invention. It is therefore intended that this invention be limited only as indicated by the appended claims.

We claim:

1. A power supply device comprising:
a transformer having a top surface; and
a heat-dissipating mechanism including
a heat-dissipating fan unit connected pivotally to said transformer and pivotable relative to said transformer to lie on said top surface of said transformer, an inclination angle of said heat-dissipating fan unit relative to said top surface being adjustable, and
an activating unit including a control switch for controlling activation of said heat-dissipating fan unit.

2. The power supply device as claimed in claim 1, wherein said transformer further has an engaging groove formed in said top surface, said heat-dissipating mechanism further including a supporting member that is connected rotatably to said heat-dissipating fan unit and that has a free end pivotable relative to said heat-dissipating fan unit to engage said engaging groove in said transformer for supporting and maintaining said heat-dissipating fan unit at an inclined position.

3. The power supply device as claimed in claim 1, wherein said heat-dissipating mechanism further includes a protective cover connected pivotally to said transformer for covering said heat-dissipating fan unit.

4. The power supply device as claimed in claim 3, wherein said transformer further has opposite front and rear ends, said heat-dissipating fan unit being connected pivotally to said front end of said transformer and having a back surface formed with a plurality of positioning grooves arranged along a front-to-rear direction, said protective cover being connected pivotally to said rear end of said transformer and including a retaining hook engageable within a selected one of said engaging grooves in said heat-dissipating fan unit to support and maintain said heat-dissipating fan unit at a selected one of a plurality of inclined positions.

5. The power supply device as claimed in claim 4, wherein said transformer further has a retaining groove formed in said front end, said retaining hook of said protective cover being engageable removably within said retaining groove in said transformer for preventing rotation of said protective cover and said heat-dissipating fan unit relative to said transformer when said protective cover is disposed at a covering position to thereby cover said heat-dissipating fan unit.

6. The power supply device as claimed in claim 4, wherein said activating unit further includes a circuit board disposed in said transformer, and an electrical wire connected electrically between said heat-dissipating fan unit and said circuit board, said power supply device further comprising a power transmission line connected to said transformer so as to allow electrical power to be transmitted to said circuit board via said power transmission line and said transformer, said control switch being disposed on said transformer to control supply of electrical power to said circuit board and, thus, activation of said heat-dissipating fan unit.

7. The power supply device as claimed in claim 6, wherein said transformer further includes an accommodating space for receiving said circuit board, a guide slot disposed in front of and communicated with said accommodating space, and an opening disposed above and communicated with said accommodating space and permitting said retaining hook to be inserted into said accommodating space through said opening when said protective cover is disposed at the covering position, said retaining hook having a recess, said circuit board having a contact portion, said control switch including a retaining rod disposed movably in said accommodating space, and a pushing portion extending laterally from said retaining rod and movably through said guide slot for guiding movement of said retaining rod in said accommodating space in a direction, said pushing portion being movable along said guide slot between a first position whereat said retaining rod is engaged within said recess in said retaining hook when said protective cover is disposed at the covering position and whereat said retaining rod is spaced apart from said contact portion of said circuit board to deactivate said heat-dissipating fan unit, and a second position whereat said retaining rod is spaced apart from said recess in said retaining hook when said protective cover is disposed at the covering position and whereat said retaining rod is in contact with said contact portion to activate said heat-dissipating fan unit.

8. The power supply device as claimed in claim 7, wherein said activating unit further includes a spring for biasing said pushing portion of said control switch toward said first position.

9. The power supply device as claimed in claim 8, wherein said retaining rod of said control switch further has an inclined surface, said retaining hook coming into contact with said inclined surface of said retaining rod to thereby move said retaining rod to contact said contact portion of said circuit board so as to activate said circuit board when said retaining hook is inserted into said accommodating space through said opening.

10. The power supply device as claimed in claim 1, wherein said activating unit further includes a circuit board disposed in said transformer, and an electrical wire connected electrically between said heat-dissipating fan unit and said circuit board, said power supply device further comprising a power transmission line connected to said transformer so as to allow electrical power to be transmitted to said circuit board via said power transmission line and said transformer, said control switch being disposed on said transformer to control supply of electrical power to said circuit board and, thus, activation of said heat-dissipating fan unit.

11. A power supply assembly comprising:
a portable electronic device; and
a power supply device including
a transformer having a top surface,
a first power transmission line connected to one end of said transformer,
a second power transmission line connected to the other end of said transformer and connected removably and electrically to said portable electronic device, and
a heat-dissipating mechanism including
a heat-dissipating fan unit connected pivotally to said transformer and pivotable relative to said transformer to lie on said top surface of said transformer, an inclination angle of said heat-dissipating fan unit relative to said top surface being adjustable, and
an activating unit including a control switch for controlling activation of said heat-dissipating fan unit.

12. The power supply assembly as claimed in claim 11, wherein said transformer further has an engaging groove formed in said top surface, said heat-dissipating mechanism further including a supporting member that is connected rotatably to said heat-dissipating fan unit and that has a free end pivotable relative to said heat-dissipating fan unit to engage said engaging groove in said transformer for supporting and maintaining said heat-dissipating fan unit at an inclined position.

13. The power supply assembly as claimed in claim 11, wherein said heat-dissipating mechanism further includes a protective cover connected pivotally to said transformer for covering said heat-dissipating fan unit.

14. The power supply assembly as claimed in claim 13, wherein said transformer further has opposite front and rear ends, said heat-dissipating fan unit being connected pivotally to said front end of said transformer and having a back surface formed with a plurality of positioning grooves arranged along a front-to-rear direction, said protective cover being connected pivotally to said rear end of said transformer and including a retaining hook engageable within a selected one of said engaging grooves in said heat-dissipating fan unit to support and maintain said heat-dissipating fan unit at a selected one of a plurality of inclined positions.

15. The power supply assembly as claimed in claim 14, wherein said transformer further has a retaining groove formed in said front end, said, retaining hook of said protective cover being engageable removably within said retaining groove in said transformer for preventing rotation of said protective cover and said heat-dissipating fan unit relative to said transformer when said protective cover is disposed at a covering position to thereby cover said heat-dissipating fan unit.

16. The power supply assembly as claimed in claim 14, wherein said activating unit further includes a circuit board disposed in said transformer, and an electrical wire connected electrically between said heat-dissipating fan unit and said circuit board, aid first power transmission line connected to said transformer so as to allow electrical power to be transmitted to said circuit board via said first power transmission line and said transformer, said control switch being disposed on said transformer to control supply of electrical power to said circuit board and, thus, activation of said heat-dissipating fan unit.

17. The power supply assembly as claimed in claim 16, wherein said transformer further includes an accommodating space for receiving said circuit board, a guide slot disposed in front of and communicated with said accommodating space, and an opening disposed above and communicated with said accommodating space and permitting said retaining hook to be inserted into said accommodating space through said opening when said protective cover is disposed at the covering position, said retaining hook having a recess, said circuit board having a contact portion, said control switch including a retaining rod disposed movably in said accommodating space, and a pushing portion extending laterally from said retaining rod and movably through said guide slot for guiding movement of said retaining rod in said accommodating space in a direction, said pushing portion being movable along said guide slot between a first position whereat said retaining rod is engaged within said recess in said retaining hook when said protective cover is disposed at the covering position and whereat said retaining rod is spaced apart from said contact portion of said circuit board to deactivate said heat-dissipating fan unit, and a second position whereat said retaining rod is spaced apart from said recess in said retaining hook when said protective cover is disposed at the covering position and whereat said retaining rod is in contact with said contact portion to activate said heat-dissipating fan unit.

18. The power supply assembly as claimed in claim 17, wherein said activating unit further includes a spring for biasing said pushing portion of said control switch toward said first position.

19. The power supply assembly as claimed in claim 18, wherein said retaining rod of said control switch further has an inclined surface, said retaining hook coming into contact with said inclined surface of said retaining rod to thereby move said retaining rod to contact said contact portion of said circuit board so as to activate said circuit board when said retaining hook is inserted into said accommodating space through said opening.

20. The power supply assembly as claimed in claim 11, wherein said activating unit further includes a circuit board disposed in said transformer, and an electrical wire connected electrically between said heat-dissipating fan unit and said circuit board, said first power transmission line connected to said transformer so as to allow electrical power to be transmitted to said circuit board via said first power transmission line and said transformer, said control switch being disposed on said transformer to control supply of electrical power to said circuit board and, thus, activation of said heat-dissipating fan unit.

* * * * *